(12) United States Patent
Lim et al.

(10) Patent No.: US 7,934,513 B2
(45) Date of Patent: May 3, 2011

(54) FACILITY WITH MULTI-STORIED PROCESS CHAMBER FOR CLEANING SUBSTRATES AND METHOD FOR CLEANING SUBSTRATES USING THE FACILITY

(75) Inventors: Joung-Hyeon Lim, Suwon (KR);
Jung-Keun Cho, Seoul (KR);
Kyo-Woog Koo, CheonAn (KR); In-Ho Bang, CheonAn (KR); Woo-Young Kim, CheonAn (KR); Man-Seok Oh, ChungCheongNam-do (KR); Hyun-Jong Kim, ChungCheongBuk-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1149 days.

(21) Appl. No.: 10/574,113

(22) PCT Filed: Oct. 7, 2004

(86) PCT No.: PCT/KR2004/002565
§ 371 (c)(1),
(2), (4) Date: Dec. 29, 2006

(87) PCT Pub. No.: WO2005/034227
PCT Pub. Date: Apr. 14, 2005

(65) Prior Publication Data
US 2007/0224820 A1    Sep. 27, 2007

(30) Foreign Application Priority Data

| Oct. 8, 2003 | (KR) | .................. 10-2003-0069969 |
| Nov. 24, 2003 | (KR) | .................. 10-2003-0083671 |
| Nov. 24, 2003 | (KR) | .................. 10-2003-0083709 |
| Jun. 3, 2004 | (KR) | .................. 10-2004-0040264 |
| Jul. 1, 2004 | (KR) | .................. 10-2004-0051189 |

(51) Int. Cl.
*B08B 3/00* (2006.01)

(52) U.S. Cl. .......... 134/95.2; 134/61; 134/84; 134/95.3; 134/117

(58) Field of Classification Search ............... 134/44, 134/61, 66, 76, 84, 88, 95.2, 95.3, 117, 198
See application file for complete search history.

(56) References Cited

U.S. PATENT DOCUMENTS 6,478,035 B1 * 11/2002 Niuya et al. ................ 134/95.2
(Continued)

FOREIGN PATENT DOCUMENTS

JP          62-136824          6/1987
(Continued)

OTHER PUBLICATIONS

International Search Report for parent application PCT/KR2004/002565, mailed Jan. 21, 2005.
(Continued)

*Primary Examiner* — Michael Barr
*Assistant Examiner* — Jason Heckert
(74) *Attorney, Agent, or Firm* — Harness, Dickey & Pierce, P.L.C.

(57) ABSTRACT

A facility for cleaning substrates such as semiconductor wafers includes a loading/unloading part, an aligning part where wafers are repositioned from a horizontal state to a vertical state, a cleaning part performing etchant-treating, rinsing, and drying processes for wafers and having a plurality of process chamber stacked, and an interface part where a transfer bath is disposed to transfer wafers between the process chambers. When the wafers are transferred between the process chamber, the transfer bath is filled with deionized water (DI water) to prevent their exposure to the air. Wafers drawn out of the loading/unlading part are repositioned from a horizontal state to a vertical state and are transferred to a first process chamber being one of the process chambers to be subjected to a part of processes. After the wafers are transferred to a second process chamber being the other one of the process chambers to be subjected to the other processes, they are repositioned from a vertical state to a horizontal state. That is, the wafers are transferred along a loop shape to be processed.

26 Claims, 9 Drawing Sheets

U.S. PATENT DOCUMENTS

| | | | |
|---|---|---|---|
| 2002/0059943 A1* | 5/2002 | Inagaki | 134/18 |
| 2003/0038269 A1* | 2/2003 | Creissel et al. | 251/337 |
| 2003/0053894 A1* | 3/2003 | Matsumoto | 414/217 |
| 2003/0075046 A1* | 4/2003 | Lenzing | 95/267 |
| 2004/0018745 A1* | 1/2004 | Tashiro et al. | 438/758 |

FOREIGN PATENT DOCUMENTS

| | | | |
|---|---|---|---|
| JP | 02-263438 | | 10/1990 |
| JP | 06-163505 | * | 6/1994 |
| JP | 07-037845 | | 2/1995 |
| JP | 09-183019 | | 7/1997 |
| JP | 2000-26080 | * | 1/2000 |
| JP | 2000-183019 | * | 6/2000 |
| JP | 2001-338904 | | 7/2001 |
| JP | 2001-259543 | | 9/2001 |
| JP | 2002-110609 | | 4/2002 |
| KR | 10-2001-0058682 | | 7/2001 |
| KR | 10-2002-0027205 | | 4/2002 |
| KR | 10-2002-0087637 | | 11/2002 |
| KR | 10-2003-0091047 | | 12/2003 |

OTHER PUBLICATIONS

Written Opinion for parent application PCT/KR2004/002565, mailed Jan. 21, 2005.

Office Action in corresponding Korean Application No. 10-2004-0051189 mailed Jan. 26, 2006 and English translation thereof.

* cited by examiner

[Fig. 1]
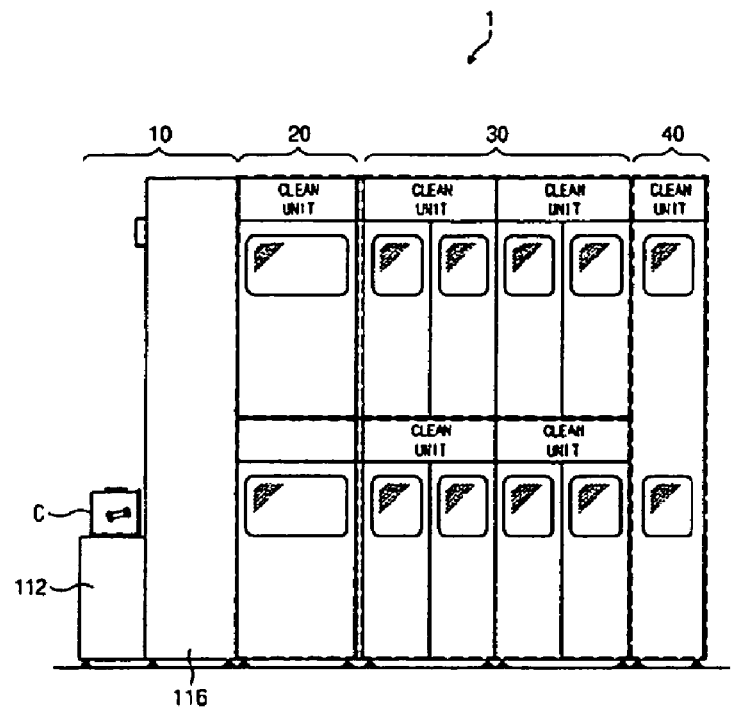
[Fig. 2]
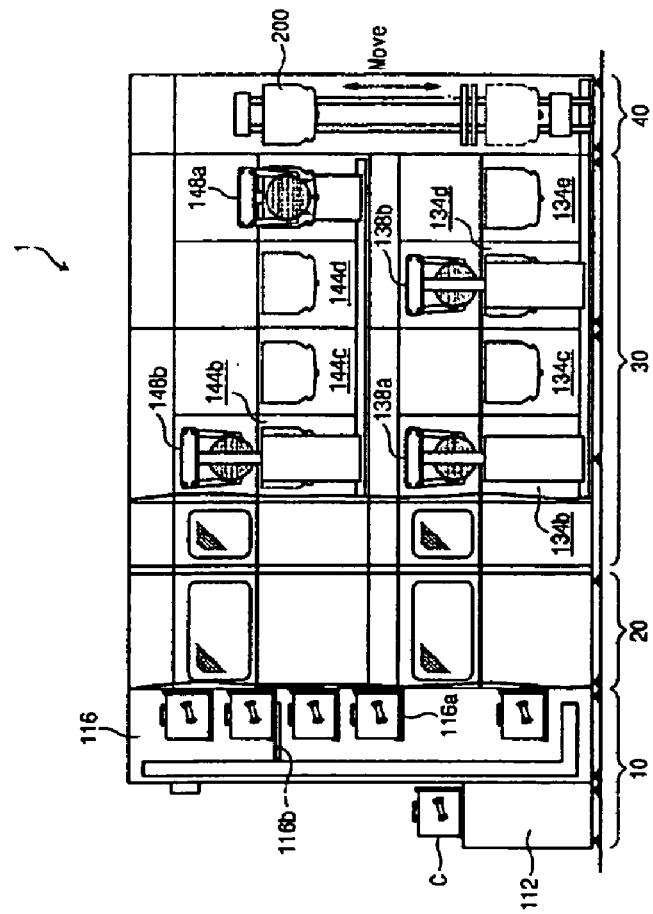

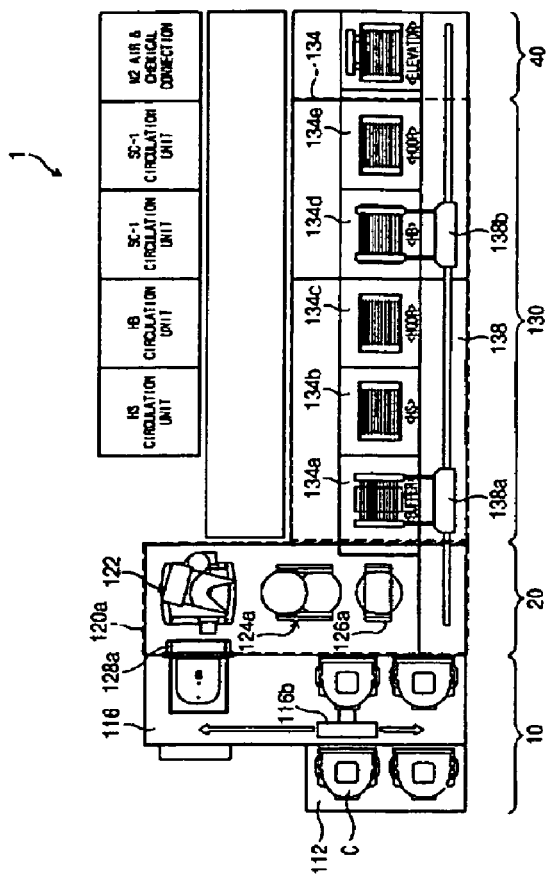
[Fig. 3]
[Fig. 4]

[Fig. 5]
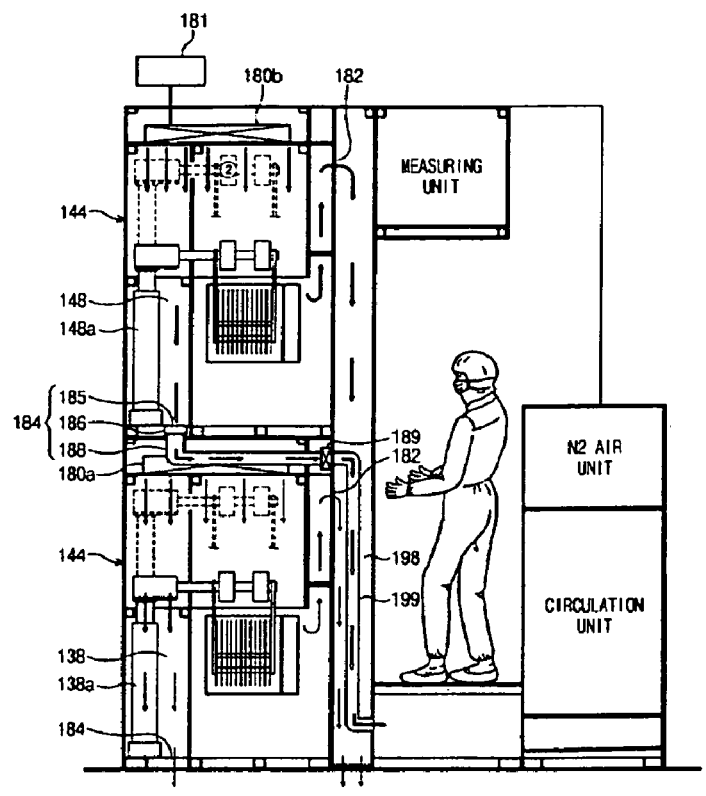
[Fig. 6]
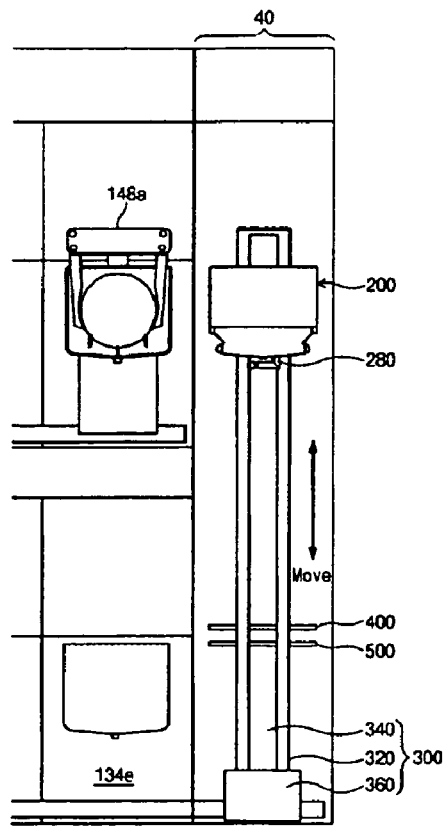

[Fig. 7]
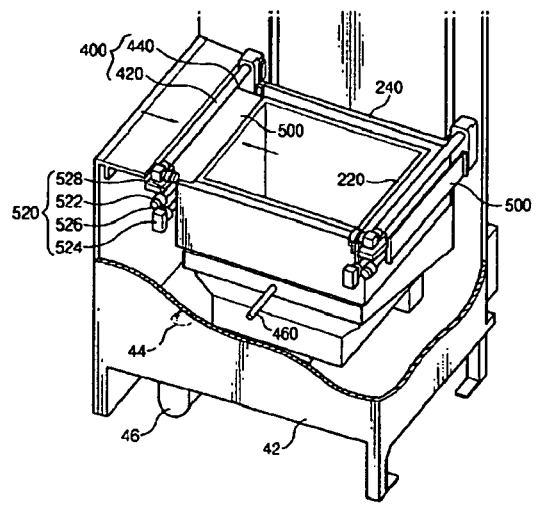
[Fig. 8]
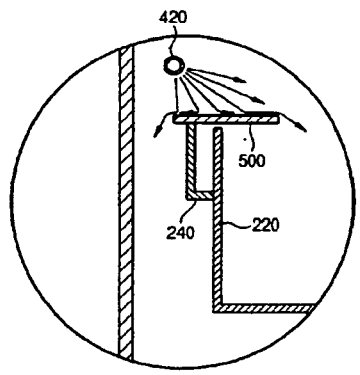
[Fig. 9]
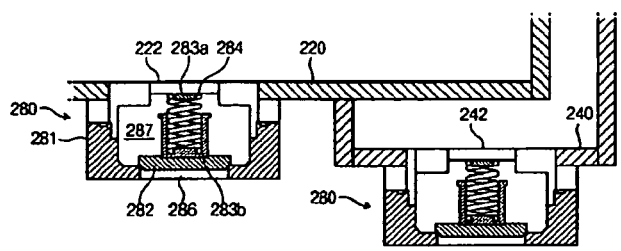
[Fig. 10]
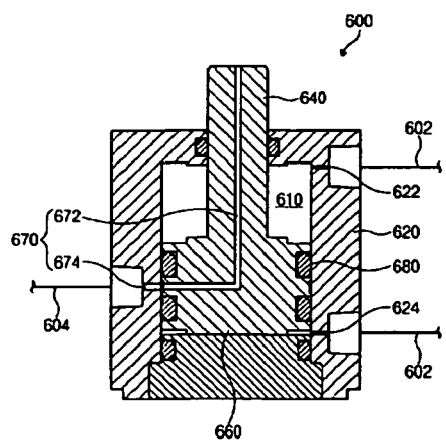

[Fig. 11]
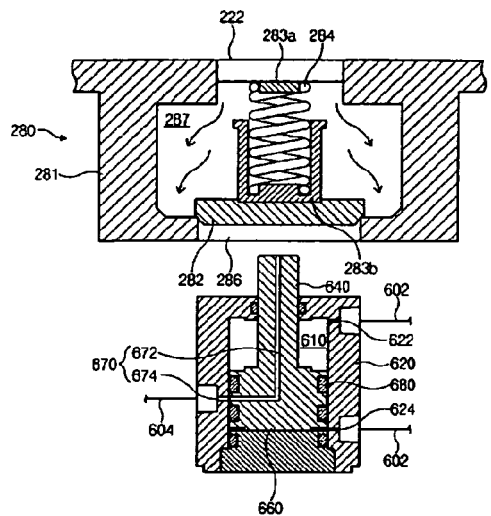
[Fig. 12]
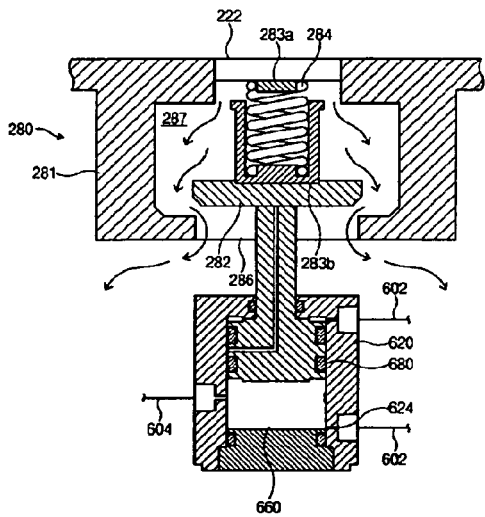
[Fig. 13]
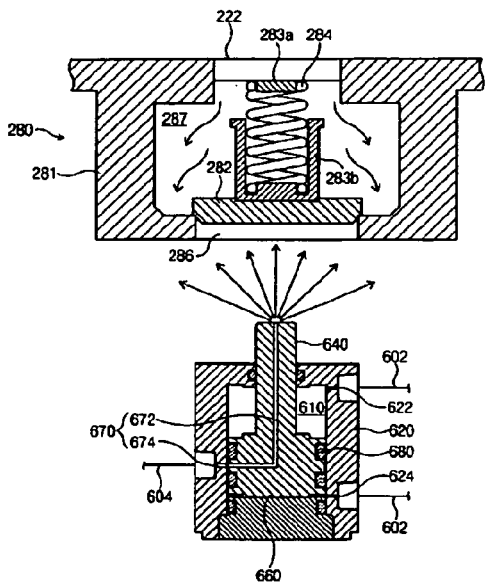

[Fig. 14]
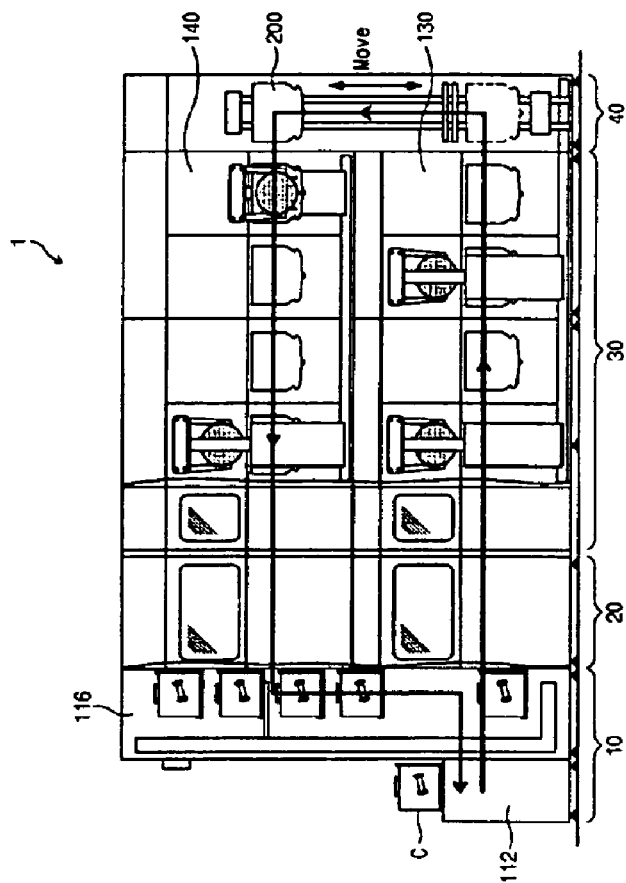
[Fig. 15]
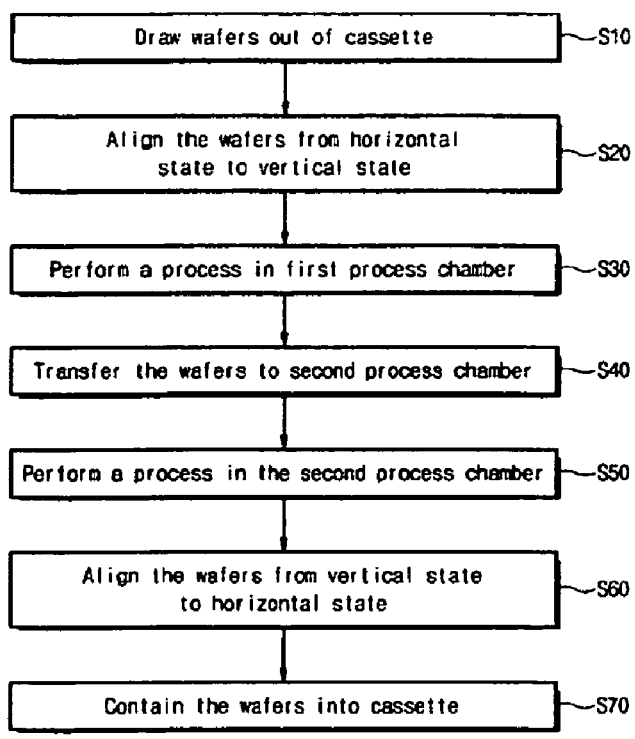

[Fig. 16]
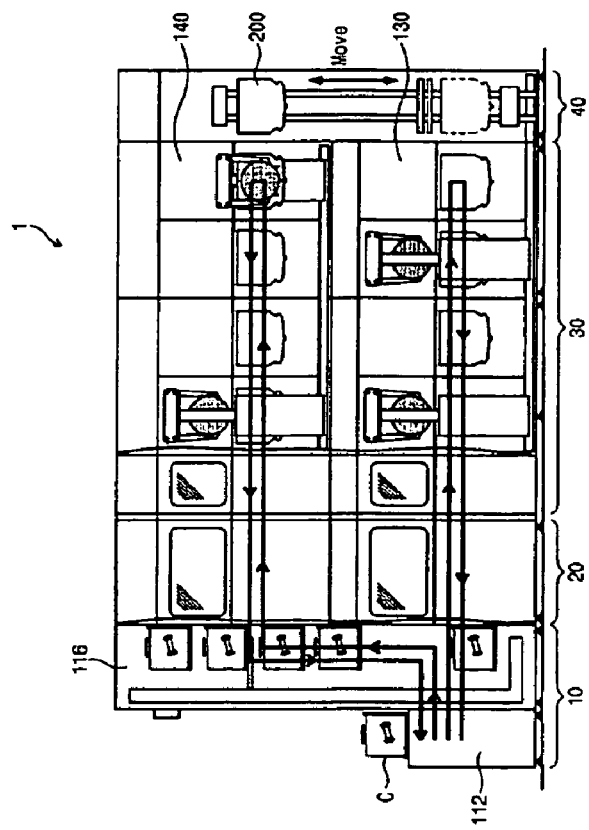
[Fig. 17]
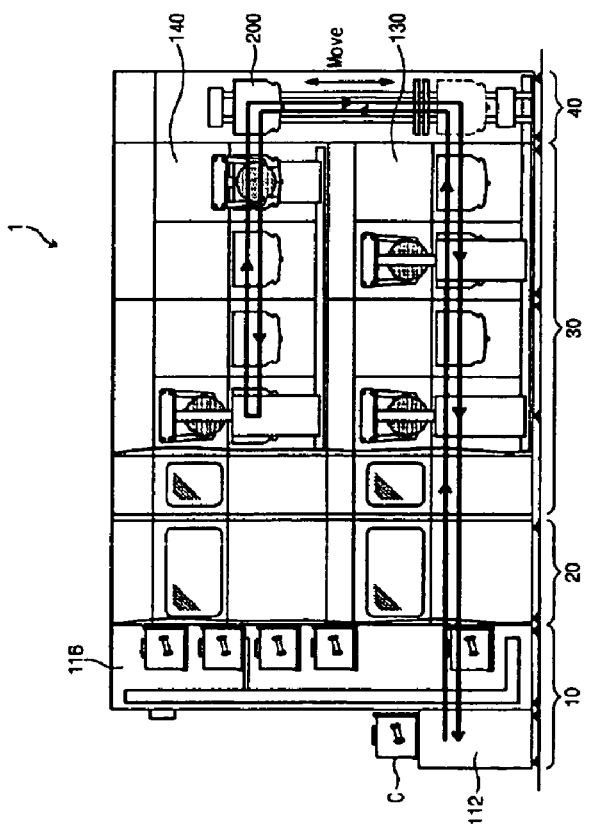

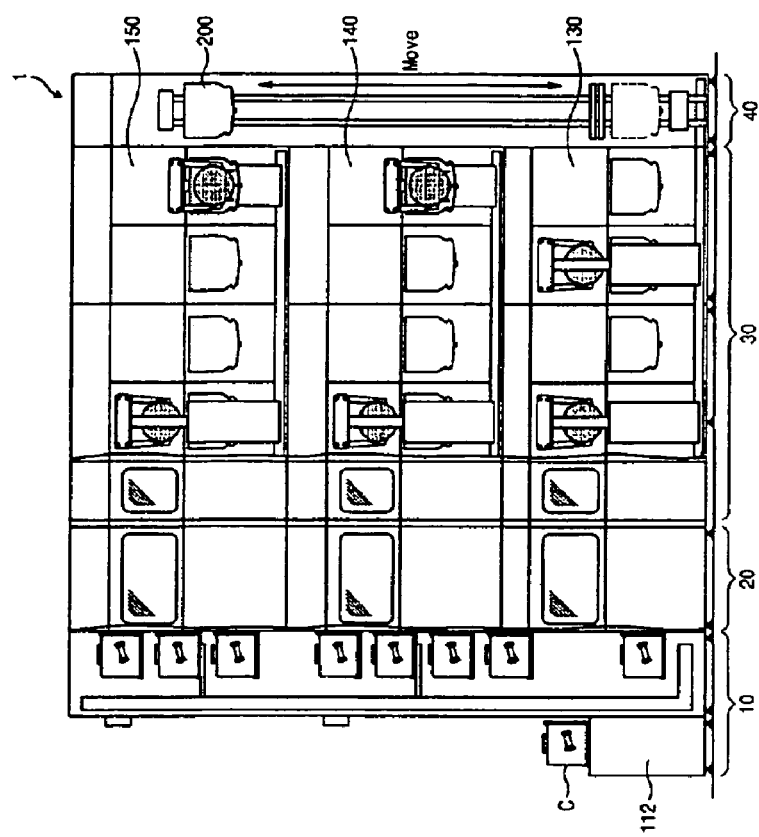
[Fig. 18]
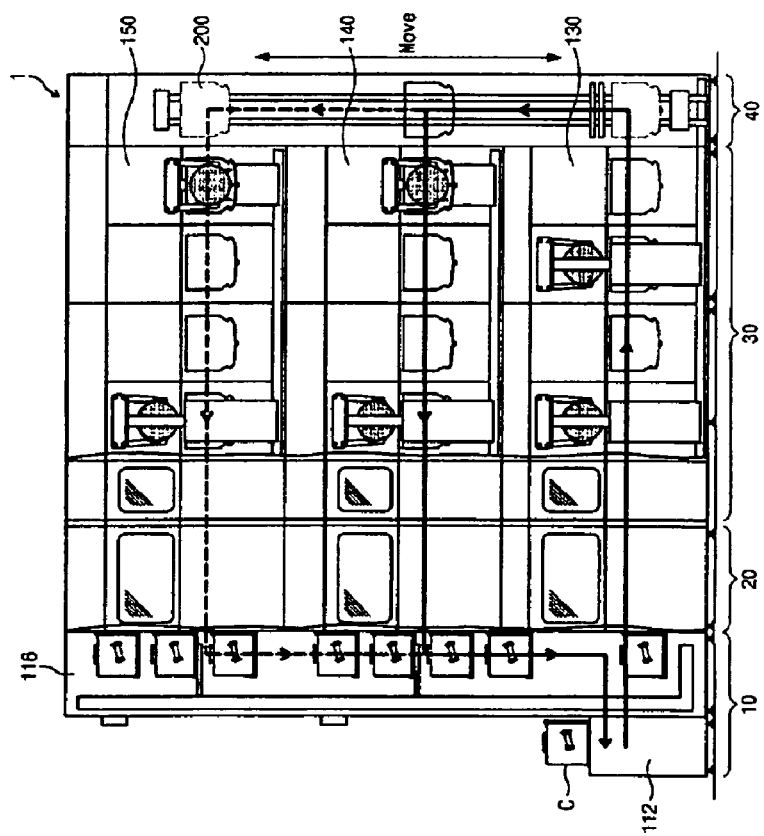
[Fig. 19]

[Fig. 20]
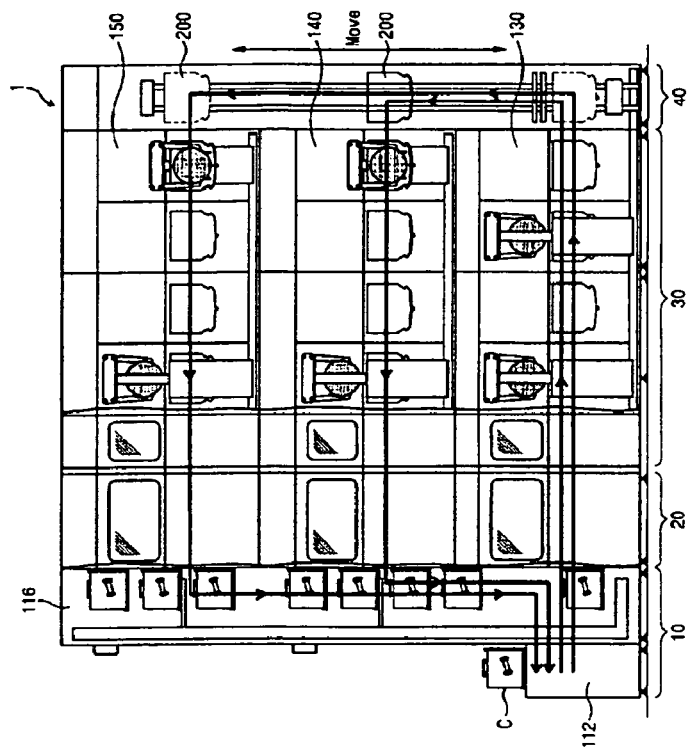
[Fig. 21]
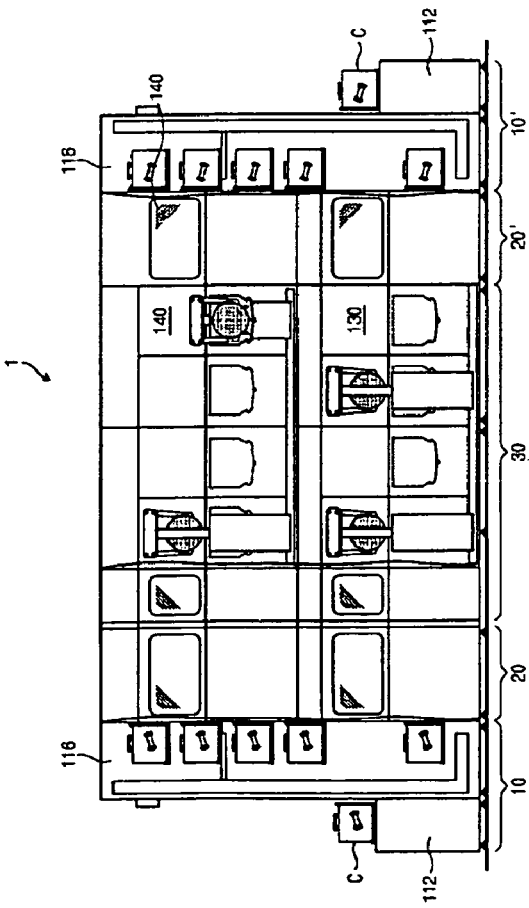

FACILITY WITH MULTI-STORIED PROCESS CHAMBER FOR CLEANING SUBSTRATES AND METHOD FOR CLEANING SUBSTRATES USING THE FACILITY

BRIEF DESCRIPTION OF THE DRAWINGS

1. Technical Field

The present invention relates to facility and method for manufacturing semiconductor devices and, more particularly, to facility and method for cleaning substrates such as semiconductor wafers.

2. Background Art

When a semiconductor wafer is manufactured with integrated circuits, a wafer cleaning process must be performed to remove residual chemicals, small particles, contaminants or the like. The wafer cleaning process comprises an chemical treating process for etching or removing contaminants on a wafer using a chemical reaction, a rinsing process for rinsing an chemically treated wafer using deionized water (DI water), and a drying process for finally drying a wafer. In order to perform these processes, a variety of processing baths are used. The processing baths includes, for example, a processing bath in which a mixed solution of ammonium hydroxide ($NH_4OH$), hydrogen peroxide ($H_2O_2$), and water ($H_2O$) is used to remove organic matters on a wafer, a processing bath in which a mixed solution of hydrochloric acid (HCL), hydrogen peroxide ($H_2O_2$), and water ($H_2O$) is used to remove inorganic matters on the wafer, a processing bath in which diluted hydrofluoric acid is used to a native oxide layer or inorganic contaminants, a processing bath in which a rinsing process is performed, a processing bath in which a drying process is performed, and so forth.

A typical cleaning facility has a cleaning part where the above-mentioned processing baths are disposed in a row. A loading part and an unloading part are disposed at both ends of the cleaning part, respectively. A cassette containing a to-be-processed wafer is placed on the loading part, and a cassette containing a completely cleaned wafer is placed on the unloading part. A transfer robot is disposed in the cleaning part to transfer wafers between the above-mentioned processing baths. A cassette transporting part is juxtaposed with a lateral face of the cleaning part to transport an empty cassette from the loading part to the unloading part.

Unfortunately, the foregoing cleaning facility occupies a very large area because of a number of processing baths, a loading part, and an unloading part. With recent trends toward larger caliber of wafers, processing baths increase in size. Thus, the above-mentioned problem becomes severe. In addition, the cassette transporting part makes a system configuration complex.

DISCLOSURE OF INVENTION

Exemplary embodiments of the present invention provides a cleaning facility for efficiently perform a process even with a small-sized installation area and a cleaning method using the facility.

In an exemplary embodiment, the cleaning facility includes a cleaning part having a plurality of stacked process chambers. At least one processing bath and a transfer robot are disposed at the respective process chambers. At least one selected from the group consisting of a chemical treating process, a rinsing process, and a drying process is performed in the respective processing baths. Each of the process chambers includes a processing part and a transporting part. A plurality of processing baths are disposed at the processing part, and a transfer robot is installed at the transporting part to transfer substrates between the processing baths. At the process chamber having the processing bath in which a drying process is performed, the transfer robot includes a first robot for transferring wet substrates and a second robot for transferring dry substrates. A buffer part may be disposed in the respective process chambers. A cassette sojourns at the buffer part temporarily. Each of the process chambers includes a fan filter unit for supplying clean gas into the process chamber, a first exhaust part configured for exhausting fumes around the processing bath, and a second exhaust part configured for forcibly exhausting particles around the transfer part. The second exhaust part has an exhaust pipe connected to a bottom of the second transfer part, a damper for opening and closing a path of the exhaust pipe, and an exhaust fan for regulating the amount of particles exhausted through the exhaust pipe.

In some embodiments, the facility further comprises an interface part where substrates are transferred between the process chambers. The interface part includes a transfer bath containing substrate to prevent exposure of substrates to the air and a transfer bath moving part for allowing the transfer bath to move up and down. In an exemplary embodiment, the transfer bath includes a nozzle configured for supplying a cleaning solution thereinto. The substrates are transferred between the process chambers while being submerged in the cleaning solution of the transfer bath. The transfer bath may further include a cleaning solution supply pipe for supplying a cleaning solution thereinto. Deionized water (DI water) may be uses as the cleaning solution. The transfer bath moving part includes a frame extending to have a height from the lowest process chamber to the highest process chamber and having a guide rail, a slider combined with the guide rail to move up and down therealong, and a driving part for moving the slider. The transfer bath is mounted at the slider.

In an exemplary embodiment, the transfer bath includes an inner bath in which substrates are contained, a cleaning solution supply part for supplying a cleaning solution into the inner bath, and an outer bath disposed to surround an outer sidewall of the inner bath. A cleaning solution overflowing from the inner bath is contained in the outer bath. The cleaning solution supply part includes a nozzle configured for injecting a cleaning solution to an open top of the inner bath. When the substrates are contained in the transfer bath, a rinsing process is performed in the transfer bath.

A guide plate is installed at the interface part to guide a cleaning solution falling on an outer sidewall of the transfer bath to the inside of the transfer bath or the outside spaced apart from the outer sidewall of the transfer bath. Preferably, one end of the guide plate extends inwardly toward an inner sidewall of the inner bath, and the other end thereof extends outwardly toward the outer sidewall of the outer bath. In an exemplary embodiment, the nozzle may be fixedly installed at a determined position of the interface part, and the guide plate may be mounted on an inner wall of the interface part to be shorter than the nozzle and taller than the transfer bath when the cleaning solution is filled. By means of a guide plate moving part, the guide plate may move to be in a guide state where the flow of a cleaning solution is guided while the cleaning solution is supplied into the transfer bath and in a non-interference state where the movement of the transfer bath is not interfered.

The transfer bath includes an exhaust valve configured for exhausting a cleaning solution. Preferably, the exhaust valve is made of an elastic member to continue to cut off its outlet when an external force is not applied. In an exemplary embodiment, the exhaust valve includes a body, a shield plate opposite to a bottom of the body in the body to open and close the outlet of the exhaust valve, and a spring installed in the body to press the shield plate. The interface part further includes a switch for opening and closing the exhaust valve. In an exemplary embodiment, the switch includes a body having a space into which at least a part of the rod is inserted and including first and second openings acting as a path through which a fluid flows in or out and a separation plate moved between formed positions of the first and second openings by the fluid flowing in through the first or second opening. Simultaneously to movement of the separation plate, the road pushes up the separation plate to open the exhaust valve.

The switch may further include a gas injection part for injecting a dry gas to the injection valve to dry the exhaust valve. In an exemplary embodiment, the gas injection part includes an injection line being a hole through which the separation plate and the rod to penetrate and an inflow port formed at the body to supply a dry gas to the injection line while the rod moves to close the exhaust valve.

The substrate cleaning facility may further comprise a loading/unloading part in which a cassette is contained and an aligning part disposed between the loading/unloading part and the cleaning part to convert each substrate to a vertical state to a horizontal state or vice versa. The loading/unloading part may have an in/out port at which a cassette loaded/unloaded to/from the facility is placed and a stocker disposed between the in/out port and the cleaning part to temporarily contain the cassettes. The stocker includes a rack on which cassettes are placed and a robot for transferring the cassette.

The aligning part comprises at least one aligner for converting substrates to a vertical state from a horizontal state. The aligner includes at least one horizontal return robot for putting/drawing substrates in/out of a cassette, a rotatable repositioning device containing substrates returned by the horizontal return robot, and a pusher for separating substrates from the repositioning device to transfer the substrates to the cleaning part.

In an exemplary embodiment, the substrates are cleaned while being transferred along a loop shape of the aligning part, a first process chamber being one of the process chambers, the interface part, a second process chamber being the other of the process chamber, and the aligning part. Preferably, the cleaning baths are arranged in a row according to the order of processes performed in the first and se and process chambers.

Exemplary embodiments of the present invention provide a method for cleaning substrates in a cleaning facility having a multi-storied structure. The methods comprises transferring substrates to at least two layer-partitioned process chambers from a cassette placed at a loading/unloading part, performing a part of cleaning processes for substrates in a first process chamber being one of the process chambers, transferring the substrates to a second process chamber being the other of the process chambers, performing a part of the cleaning processes for the substrates in the second process chamber, and containing the substrates in the cassette placed at the loading/unloading part.

The cleaning baths are arranged in a row according to the order of processes performed in the first and second process chambers. Preferably, the substrates are transferred along a loop shape. Preferably, when the substrates are transferred from the first process chamber to the second process chamber, they are not exposed to the air.

The transferring substrates from the first process chamber to the second process chamber comprises placing the substrates completely subjected to a part of the processes in the first process chamber into a transfer bath disposed one side of the first and second process chambers, transferring the transfer bath up and down, and drawing the substrates out of the transfer baths to be transferred to the second process chamber. Preferably, when the transfer bath is transferred from the first process chamber to the second process chamber, the transfer bath is filled with deionized water (DI water). The method may further comprise performing a rinsing process in the transfer bath while the substrates are transferred between the process chambers.

The method further comprises repositioning the substrates from a horizontal state to a vertical state before a process is performed in the first process chamber and repositioning the substrates from a vertical state to a horizontal state after a process is completed in the second process chamber.

BRIEF DESCRIPTION OF DRAWINGS

FIG. 1 is an exterior view showing a configuration of a cleaning facility according to the present invention.

FIG. 2 illustrates an internal configuration of the cleaning facility shown in FIG. 1.

FIG. 3 and FIG. 4 are top plan views of a first process chamber and a second process chamber of a cleaning part, respectively.

FIG. 5 illustrates fan filter units and exhaust parts of the cleaning facility.

FIG. 6 is a front view showing an internal configuration of an interface part.

FIG. 7 is a perspective view showing an example of a transfer bath.

FIG. 8 illustrates a flow of deionized water (DI water) dropping on a guide plate when the guide plate is disposed under a guide state.

FIG. 9 is a cross-sectional view of a drain port formed at the bottom of inner and outer baths and drain valves connected to the exhaust port.

FIG. 10 is a cross-sectional view showing an example of a switch.

FIG. 11 and FIG. 12 illustrate the states that an outlet of a drain valve is closed and opened, respectively.

FIG. 13 illustrates the state that dry gas is supplied from a switch to a drain valve.

FIG. 14 illustrates a preferred example of a wafer transfer path in the cleaning facility shown in FIG. 2.

FIG. 15 is a flowchart showing the steps of a cleaning method according to an embodiment of the present invention.

FIG. 16 and FIG. 17 illustrate another wafer transfer paths in the cleaning facility shown in FIG. 2, respectively.

FIG. 18 illustrates another example of the cleaning facility according to the present invention.

FIG. 19 and FIG. 20 illustrate examples of a wafer transfer path in the cleaning facility shown in FIG. 18, respectively.

FIG. 21 illustrates another example of the wafer transfer path in the cleaning facility according to the present invention.

BEST MODE FOR CARRYING OUT THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A configuration of a cleaning facility 1 according to the present invention is illustrated in FIG. 1. The cleaning facility 1 includes a loading/unloading part 10, an aligning part 20, a cleaning part 30, and an interface part 40 which may be disposed in a row. A cassette "C" containing to-be-processed wafers and a cassette "C" containing processed wafers are placed on the loading/unloading part 10. Wafers drawn out from the loading/unloading part 10 or the cleaning part 30 are realigned at the aligning part 20. The cleaning part 30 has a plurality of process chambers 130 and 140 which are stacked. The cleaning part 30 takes charge of a chemical treating process, a rinsing process, and a drying process. The interface part 40 is configured for transferring wafers between process chambers 130 and 140.

As illustrated in FIG. 2, FIG. 3, and FIG. 4, the loading/unloading part 10 includes an in/out port 112 and a stocker 116. The cassette "C" containing wafers are externally located at the input/output port 112 by an automated guided vehicle (or rail guided vehicle). A front open unified pod (FOUP) may be used as a cassette "C" The FOUP is a kind of a sealed container, in which 25 wafers are contained to stand upright. The stocker 116 is disposed at a lateral face of the in/out port 112. Cassette "C" are held in the stocker 116. A plurality of racks 116a and a robot 116b are disposed in the stocker 116. Cassettes "C" are placed on the racks 116, and the robot 116 transfers a cassette "C" in the stocker 116.

The aligning part 20 has a first align chamber 120a and a second align chamber 120b which are partitioned in the order named. That is, the first align chamber 120a is disposed below the second align chamber 120b. In order to suitably clean wafers, they are realigned from a horizontal state to a vertical state. Door openers 128a and 128b may be installed at the first and second align chambers 120a and 120b to open a door of a cassette "C" respectively. Alternatively, the aligning part 120 may have only one align chamber.

An aligner is provided to the respective align chambers 120a and 120b. The aligner has horizontal return robots 122a and 122b, repositioning devices 124a and 124b, and pushers 126a and 126b. The horizontal return robot 122a draws wafers from a cassette "C" and transfers the wafers to the repositioning device 124a. The repositioning device 124a includes a frame where slots are formed. The wafers transferred from the horizontal return robot 122a are inserted into the slots. The frame is rotatable in a 90-degree arc. If the frame starts to rotate, the wafers contained in the frame are realigned from a horizontal state to a vertical state. By the pusher 126, the wafers realigned to a vertical state are drawn out of the frame. Thereafter, they are transferred to the cleaning part 30 by a robot (138 of FIG. 3). Further, 50 slots are formed at the frame of the repositioning device 124a. A space of the slots may be half space of slots formed at a cassette. Generally, 50 wafers may be contained in the repositioning device 124a and be cleaned at the same time. If wafers drawn out of a cassette are contained in the repositioning device 124a, the repositioning device 124a moves straightly as far as half the space of the cassette. Afterwards, wafers drawn out of another cassette may be contained in the repositioning device 124a.

The above embodiment shows a procedure of aligning wafers before they are transferred from a cassette to a cleaning part 30 in the first align chamber 120a. In the second align chamber 120b, wafers moves inversely relative to the first align chamber 120a. After the wafers are realigned from a vertical state to a horizontal state, they are contained in a cassette. An align device, which is disclosed in Korea Patent Application No. 2000-44848 or 2003-80355, may be provided to the above-described aligning part.

The cleaning part 30 is configured for cleaning wafers. As previously stated, the cleaning part 30 has stacked process chambers. In this embodiment, a first process chamber 130 and a second process chamber 140 are stacked in the order named. Alternatively, the cleaning part may have three or more process chambers which are stacked sequentially.

A processing part 134 and a transfer path 138 are provided to the first process chamber 130. In the processing part 134, a buffer part 134 and a plurality of processing baths 134b, 134c, 134d, and 134e are disposed in a row. Further, one or more transfer robots 138a and 138b are disposed at a transfer path 138 which is formed long along a length direction. Both ends of the transfer path 138 extend to the aligning part 20 and the interface part 40, respectively. While moving along the transfer path 138, the transfer robots 138a and 138b transfers wafers from the first align chamber 120a to the first process chamber 130, and transfers wafers from the first process chamber 130 to the interface part 40. In the first process chamber 130, wafers are processed in all the processing baths 134b, 134c, 134d, and 134e or a selected one thereof.

A processing part 144 and a transfer path 148 are disposed at the second process chamber 140. Similar to the first process chamber 130, a buffer part 144a and a plurality of processing baths 144b, 144c, 144d, and 144e are disposed at the processing part 144, and transfer robots 148a and 148b are disposed at a transfer path 148. The transfer robots 148a and 148b transfer wafers from the interface part 40 to the second process chamber 140 and transfer wafers from the second process chamber 140 to the second align chamber 120b. In the second process chamber 140, wafers are processed in all the processing bath 144b, 144c, 144d, and 144e or in a selected one thereof.

Each of processing baths disposed at the first and second process chambers 130 and 140 may be one selected from the group consisting of a chemical treating bath in which wafers are cleaned using a chemical a rinsing bath in which wafers are rinsed using deionized water (DI water) or the like, and a drying bath in which wafers are dried. In the respective process chambers, the number of the processing baths may vary with processing conditions.

In the first process chamber 130, the processing baths 134b, 134c, 134d, and 134e are preferably disposed according to the order of processes performed, from one end adjacent to the first align chamber 120a to the other end adjacent to the interface part 40. In the second process chamber 140, the processing baths 144b, 144c, 144d, and 144e are preferably disposed according to the order of processes performed, from a point adjacent to the interface part 40 to a point adjacent to the second align chamber 120b. This makes it possible to minimize a transfer path of wafers during a process.

In the second process chamber 140, transfer robots disposed at the transfer path 140 are a first robot 148a and a second robot 148b. Preferably, the first robot 148a transfers only wet wafers and the second robot 148b transfers dry wafers. This is because wafers are contaminated due to water attached to the first robot 148a when the first robot 148a transfers dry wafers. In the first process chamber 130, there are, for example, a first chemical bath 134b, a rinsing bath 134c, a second chemical bath 134d, and a rinsing bath 134e. In the second process chamber 134, there are, for example, a third chemical bath 144b, a fourth chemical bath 144c, a rinsing bath 144d, and a drying bath 144e. In the event that wafers are processed while sequentially moving along a first process chamber, an interface part, and a second process chamber, in the second process chamber 140, the first robot 148a may transfer wafers among the interface part 40, the third chemical bath 144e, the fourth chemical bath 144d, the rinsing bath 144c, and the drying bath 144b, and the second robot 148b may transfer wafers among the drying bath 144b, the buffer bath 144a, and the second align chamber 120b.

Fan filter units 180a and 180b are mounted on the first and second process chambers 130 and 140, respectively. The fan filter units control the circumstances such as humidity, particle, temperature, and so forth. FIG. 5 illustrates fan filter units 180a and 180b and exhausting parts 182 and 184. A first exhausting part and a second exhaust part are provided to the respective process chambers 130 and 140. Clean air is sent to a lower portion in the process chambers 130 and 140 by means of the fan filter units 180a and 180b. A first exhaust part and a second exhaust part are provided to the respective process chambers 130 and 140. The first exhaust part 182 is disposed at a rear side of respective processing baths to exhaust contaminated air such as fume around the processing part. The second exhaust part 184 is disposed at a bottom side of a transfer path 148 to exhaust particles produced when a transfer robot operates. According the displacement of the first exhaust part 182, the amount of air provided from the fan filter units 180a and 180b is controlled by a controller 181.

In the first process chamber 130, air around the first transfer path 138 is naturally exhausted through a second exhaust path formed below the first transfer path 138. On the other hand, in the second process chamber 140, air around the second transfer path 148 may be forcibly exhausted through a second exhaust path formed below the second transfer path 148. The second exhaust part 184 of the second process chamber 140 has an exhaust pipe 188 connected to an exhaust port 185 formed at a lower bottom of the second transfer path, a damper 186 for controlling an open rate of a path of the exhaust pipe 188, and an exhaust fan 189 for controlling a displacement. A duct 188 may be installed between fan filter units 180a disposed at an upper end of the first process chamber 130.

The interface part 40 offers a wafer-transfer space. If wafers are exposed to the air when they move between the process chambers 230 and 140, an unwanted native oxide layer is formed at the wafers. Thus, transferring wafers at the interface part 40 is done under state that they are not exposed to the air. As illustrated in FIG. 6, a transfer bath 200, a transfer bath moving part 300, and a nozzle 400 are provided to the interface part 40. The transfer bath 200 offers a wafer-containing space. The transfer bath moving part 300 allows the transfer bath 200 to move up and down in the interface part 40. The nozzle 400 provides a cleaning solution such as deionized water (DI water) into the transfer bath 200. While wafers are fully submerged in DI water, they move to process chambers 130 and 140. The transfer bath moving part 300 includes a frame 320, a guide rail 340, a slider (not shown), and a driving part 360. The frame 320 is installed at an inner wall of the interface part 40 in an up-down direction and has a length from the first process chamber 130 to the second process chamber 140. The guide rail is mounted on the frame 320. The transfer bath 200 is fixed to the slider, which is combined with the frame 320 to straightly move up and down along the guide rail 340. The driving part 360 is installed below the frame 320 to drive the slider. The driving part 320 may be an apparatus including a motor, a pulley, and a belt or an apparatus using a hydraulic and pneumatic pressure cylinder.

As illustrated in FIG. 7, the transfer bath 200 includes an inner bath 220 and an outer bath 240. The inner bath 220 is a rectangular parallelepiped tub having a top-open space. In the inner bath 220, a wafer guide (not shown) is disposed to support wafers. The wafer guide may comprise a plurality of bars where slots are formed. Wafers are inserted into the slots, respectively. Although not shown in this figure, a lift may be connected to the wafer guide to allow the wafer guide to move up and down. The outer bath 240 is spaced apart from the inner bath 220 to surround a sidewall circumference of the inner wall 220, containing a cleaning solution overflowing from the inner bath 220. Drain ports (229 and 242 of FIG. 9) are formed at the bottoms of the outer and inner bath 240 and 220, respectively.

The transfer bath 200 moves from a first point to a second point in the interface part 40. The first point is as tall as the first process chamber 130, and the second point is as tall as the second process chamber 140. When the transfer bath 200 is located at the first point, wafers processed in the first process chamber 130 are contained in the transfer bath 200. When the transfer bath 200 is located at the second point, wafers are drawn out of the transfer bath 200 to be transferred to the second process chamber 140. In an exemplary embodiment, the nozzle 400 configured for supplying a cleaning solution to the transfer bath 200 is fixed to an inner sidewall of the interface part 40. To supply a cleaning solution under state that the transfer bath 200 is located at the first point, the nozzle 400 is disposed over the transfer bath 200 located at the first point. The nozzle 400 is connected to a cleaning solution supply part and has a rod-type distribution pipe 420 connected to the cleaning solution supply part and a plurality of injection ports 440 formed in a length direction of the distribution pipe 420. A path is formed at the center of the distribution pipe 420. The injection ports 440 are configured to inject a cleaning solution flowing into the distribution pipe 420 to a transfer bath 200. The nozzle 400 is installed at both opposite sides in the interface part 40 and disposed so as not to prevent the transfer bath 200 from moving up and down. The injection port 440 is formed to allow a cleaning solution to face the center of the inner bath 220. In order to supply a cleaning solution into the inner bath 220, not only the nozzle 440 but also a cleaning solution supply pipe 460 may be further provided. The cleaning solution supply pipe 460 may be connected to a sidewall or a bottom of the inner bath 220.

On the point of starting or finishing injecting a cleaning solution from the injection port 440, the cleaning solution falls on an outer sidewall of the outer bath 240. The falling solution flows downwardly along the outer sidewall of the outer bath 240. In the case where DI water is attached to the outer sidewall of the outer bath 240, a part of the DI water flows along the outer sidewall of the outer bath 240 to fall on the bottom of the interface part 40 and the other part thereof flows along a structure connected to the outer sidewall of the outer bath 240. In this embodiment, a guide plate 500 is provided to prevent the DI water from falling on the outer sidewall of the outer bath 240. The guide plate 500 guides the DI water, which falls at a point adjacent to the outer sidewall of the outer bath 240, to flow inwardly toward the inner bath 220 or outwardly toward the outer bath 240 spaced apart from the outer sidewall of the outer bath 240. The guide plate 500 is interposed between the nozzle 400 and the transfer bath 200 disposed at the first point. The guide plate 500 may be mounted at a sidewall of the interface part 40 or the nozzle 400. Alternatively, the guide plate 500 may be mounted on the structure fixed to the inside of the interface part 40. One end of the guide plate 500 extends inwardly toward an inner sidewall of the inner bath 220, and the other end thereof has a width extending outwardly toward the outer sidewall of the outer bath 240. The guide plate 500 is longer than the sidewall of the outer bath 240 disposed in the same direction as the guide plate 500. The guide plate is installed below the respective nozzles 400.

A guide plate moving part 520 changes a position of the guide plate 500 from a guide state to a non-interference state. In the guide state, the guide plate 500 stands horizontally so as to guide the flow of a cleaning solution while the cleaning solution is supplied from the nozzle 400. In the non-interference state, the guide plate 500 deviates from a vertical top of the transfer bath 200 so as to prevent the transfer bath 200 from colliding with the guide plate 500 while the transfer bath 200 moves up and down. The guide plate moving part 520 may comprise a rotating rod 528 combined with the other end of the guide plate 500 and a driven gear 522 and a driving gear 524 rotated by a rotary actuator 526. A driven gear 522 is coupled to one side of the rotating rod 528, and the driving gear 524 gears with the driven gear 522. As the guide plate 500 rotates in a 90-degree arc, it changes from a guide state to a non-interference state. Since the above-described configuration is merely exemplary, the guide plate moving part 520 may have other configurations. As illustrated in FIG. 7, one of guide plates 500 is disposed under a guide state, and the other is disposed under a non-interference state. The guide plate 500 may be horizontally maintained or inclined in one side direction. FIG. 8 illustrates the flow of DI water falling on the guide plate 500 in the event that the guide plate 500 is disposed under a guide state.

As previously stated in this embodiment, the guide plate 500 and the nozzle 400 are installed at predetermined positions of the interface part 40, respectively. Alternatively, they may be installed to be coupled to a transfer bath, respectively. In that case, the guide plate 500 may have the same rotatable structure as described in the above embodiment. Alternatively, the guide plate 500 may have a fixed structure under a guide state.

Wafers may be contained in a transfer bath 200 under state that that a cleaning solution fills the transfer bath 200. Alternatively, the cleaning solution may be supplied to the transfer bath 200 while wafers are contained in the transfer bath 200. A position of the transfer bath 200 receiving the cleaning solution may be a different position in the interface part 40, except a first point and a second point.

After a group of wafers are transferred from a first process chamber 130 to a second process chamber 140, the cleaning solution filling the transfer bath 200 must be drained before another group of wafers are transferred. Drain ports 222 and 242 are formed at bottoms of the inner and outer baths 220 and 240 of a transfer bath, respectively. A drain valve 280 is connected to the drain ports 222 and 242. The drain valve may be a valve for opening and closing its internal path, where air directly flows in or out. However, if supplying air into the valve is cut off due to facility problem or the like while wafers are contained in the inner bath 220, a drain valve is opened and a cleaning solution in the inner bath 220 is drained to expose the wafers to the atmosphere while they move in the interface part 40. Preferably, the path is continuously cut off when an external force is not applied to the valve.

FIG. 9 illustrates drain ports 282 and 284 formed respectively at bottoms of the inner and outer baths 220 and 240 and drain valves 280 connected therewith. The drain valve 280 connected with the inner bath 220 is identical to the drain valve 280 connected with the drain valve. Therefore, only the drain valve 280 connected with the inner bath 220 will be described hereinbelow. Alternatively, a drain valve 280 connected with the inner bath 220 may be different from a drain valve 280 connected with the outer bath 240. The drain valve 280 is combined with the bottom of the inner bath 220 and has a body 281 where a fluid flow path is formed. An inlet is formed at the top of the body 281, and an outlet 286 is formed at the bottom thereof. A cleaning solution flowing through a drain port 222 flows into the drain valve 280 through the inlet. The cleaning solution is drained from the drain valve 280 through the outlet 286. In the path 287, a shield plate 282 and an elastic member 284 are disposed. The shield plate 282 opens and closes the outlet 286, and the elastic member 284 applies a predetermined pressure to the shield plate 282. The shield plate 282 is disposed to be opposite to the outlet 286 and has a larger sectional area than the outlet 286. One end of the elastic member 284 is coupled to a keeper 283a mounted on a top of the body 281, and the other end thereof is coupled to a keep 283b mounted on a bottom of the body 281. The elastic member 284 may be a spring. The shield plate 282 is pressed by a compressed spring to be in contact with the bottom of the body 281, thereby shutting off the outlet 286. If a stronger force than a force compressing the spring 284 is not externally applied, the drain valve 280 is continuously closed. The outlet 286 of the drain valve 280 is opened by a switch 600.

FIG. 10 illustrates an example of the switch 600. The switch 600 may be mounted on a bottom of the interface part 40 and has a body 620 in which there is a space. A first opening 622 is formed at an upper portion of an inner sidewall of the body 620, and a second opening 624 is formed at a lower portion of the inner sidewall of the body 620. A fluid flows in/out through the first and second openings 622 and 624. One supply pipe 602 is connected to the first opening 622, and another supply pipe 602 is connected to the second opening 622. The supply pipes 602 are configured for supplying a fluid such as air or nitrogen. A rod 640 is coupled to a top surface of a separation plate 660. The rod 640 protrudes outwardly toward the body 620 through a hole formed at the top surface of the body 620. The separation plate 660 and the rod 640 may be individually fabricated to be combined with each other or may be monolithically fabricated. A reference number 680 denotes an O-ring for sealing.

FIG. 11 illustrates the state that an outlet of a drain valve 286 is closed, and FIG. 12 illustrates that state that the outlet thereof is opened by a switch 600. After wafer are transferred to a second process chamber 140 at a second point, a transfer bath 200 moves to a first point. At that time, the outlet 286 is maintained at a close state by a shield plate 282 pressed by a spring 284, as shown in FIG. 11. Due to a pressure of air flowing in through the second opening 624, the separation plate 660 is elevated and the rod 640 gradually protrudes from the body 620 to push up the shield plate 282 disposed in the drain valve 280. As shown in FIG. 12, the outlet 286 of the drain valve 280 is opened and a cleaning solution is drained from the transfer bath 200 to flow to a bottom of the interface part 40. Thereafter, the cleaning solution is drained out through the drain pipe 44 connected to a drain port (46 of FIG. 8) of the bottom 42 of the interface part 40. If the cleaning solution is completely drained, air flows in through the first opening 622. Thus, the separation plate 660 drops and the shield plate 282 of the drain valve 280 is pressed by a spring 284 to close an outlet 286.

After the cleaning solution is drained, DI water may be attached to an outer surface of the drain valve 280, which is not preferable like the case that DI water is attached to an outer surface of the outer bath 240. In this embodiment, a gas injecting part 670 is provided to the switch 600 to dry an outer surface of the drain valve 280. In some exemplary embodiments, a penetrating injection line 672 is formed at the separation plate 660 and the rod 640. The injection line 672 extends from one side of the separation plate 660 to a terminal of the rod 640. At the separation plate 660 under state that the drain valve 280 is closed, an inflow port 674 is formed at a point opposite to one side of the separation plate 660, of the sidewall of the body 620. Alternatively, a position of the injection line 672 formed at the separation plate 660 and the rod 640 and a position of the inflow port 674 may be altered variously. FIG. 13 illustrates the state that dry gas is supplied from a switch to a drain valve 280.

In the above described embodiments, wafers contained in a transfer bath filled with DI water are transferred between process chambers to prevent exposure of the wafers to the air. However the above-described embodiments are merely exemplary, and various ways may be used to prevent exposure of the wafers to the air. In an exemplary embodiment, when a transfer bath is transferred, it is sealed by being filled with nitrogen gas or inert gas. Alternatively, nitrogen gas or DI water is continuously injected to wafers contained in a transfer bath.

A cleaning process will now be described more fully with reference to FIG. 14 and FIG. 15. FIG. 14 illustrates a wafer transfer path in the cleaning facility shown in FIG. 2, and FIG. 15 is a flowchart showing the steps of a cleaning method according to an embodiment of the present invention. A cassette "C" containing wafers are placed on a loading/unloading part 10. The wafers are drawn out of the cassette "C" (S10). The wafers are transferred to a first align chamber 120a to change from a horizontal state to a vertical state (S20). The wafers are transferred to a first process chamber 130. By passing processing baths 134b, 134c, 134d, and 134e in the first process chamber 130, the wafers are subjected to a predetermined process (S30). The wafers are transferred to an interface part 40 to be contained in a transfer bath 200 disposed at a first point. The transfer bath 200 is transferred to a second point while the wafers submerged in a cleaning solution are not exposed to the air (S40). The wafers are taken out of the transfer bath 200 to be transferred to a second process chamber 140. By passing processing baths 144e, 144d, 144c, and 144b in the second process chamber 140, the wafers are subjected to a predetermined process (S50). The wafers are transferred to a second aligning part 20 to change from a vertical state to a horizontal state (S60). The wafers are contained in a cassette "C"

That is, the transfer of the wafers is done through the loading/unloading part 10, the first align chamber 120a, the first process chamber 130, the interface part 40, the second process chamber 140, the second align chamber 120b, and the loading/unloading part 10 (i.e., loop shape). Alternatively, the internal structure of an aligning part 20 and a cleaning part may be varied in order to allow the transfer of the wafers to be done depending on an inverse order of the foregoing order. Their varied structure may be apparent to these skilled in the art and will not be described in further detail.

Alternatively, a rinsing process may be done in a transfer bath 200 of an interface part 40. When wafers are contained in the transfer bath 200 to be transferred from the first process chamber 130 to the second process chamber 140, DI water is continuously supplied to an inner bath 220 through a cleaning solution supply pipe 460 and the DI water overflowing from the inner bath 220 is contained in an outer bath 240. In this case, a rinse bath 134e disposed at the terminal of the first process chamber 130 may be removed.

In another embodiment, an internal structure of the cleaning part 30 may be varied. For example, as illustrated in FIG. 16, a first group of wafers are transferred to a first processing chamber 130 through a first align chamber 120a to be processed. Afterwards, the first group of the wafers return to the first align chamber 120a. A second group of wafers are transferred to a second process chamber 140 through a second align chamber 120b to be processed. Afterwards, the second group of the wafers may return to the second align room 140. In the first and second process chambers 130 and 140, the wafers are processed with different recipes. Alternatively, in at least a part of processing baths provided to the first and second process chambers 130 and 140, different processes are performed or a process is performed with different recipes. Thus, wafers partially processed in the first process chamber 130 are transferred to a second process chamber 140 through an interface part 40 to be partially processed in a processing bath of the second process chamber 140, as illustrated in FIG. 17. Afterwards, the wafers may return to the first process chamber 130 through the interface part 40.

Unlike the above embodiments, the cleaning part 30 may be partitioned into three layers or more to have three process chambers or more. For example, a first process chamber 130, a second process chamber 140, and a third process chamber 150 may be sequentially provided to the cleaning part 30. An aligning part 20 may be disposed at one side of the cleaning part 30, and an interface part 40 may be disposed at the other side thereof. In this case, the same processing baths are disposed at the second and third process chambers 140 and 150, so that wafers processed in the first process chamber 130 may be transferred to one of the second and third process chambers 140 and 150 at the interface part 40. This makes it possible to prevent wafers from being accumulated in a second process chamber when the wafers are processed at a high speed in the first process chamber 130. Alternatively, a first group of wafers may be processed while being sequentially transferred through the first process chamber 130, the interface part 40, and the second process chamber 140, and a second group of wafers may be processed while being sequentially transferred through the first process chamber 130, the interface part 40, and the third process chamber 150. This is advantageous when groups of wafers are processed with different recipes respectively.

In the above-described embodiments, an aligning part 20, a cleaning part 30, and an interface part 40 are disposed in a row. Alternatively, an aligning part 20 or an interface part 40 may be disposed in the center of a facility and a cleaning part 30 may be disposed at both sides thereof.

In still another embodiment, a first loading/unloading part 10 and a first aligning part 20 are disposed at one side of a cleaning part 30 and a second aligning part 20' and a second loading/unloading part 10' may be disposed at the other side thereof, as illustrated in FIG. 21. The cleaning part 30 may have a plurality of process chambers partitioned with layers. A first group of wafers change from a horizontal state to a vertical state in a first aligning part 20 to be processed in a first process chamber 130. The wafers processed in the first process chamber 130 changes from a vertical state to a horizontal state in the second aligning part 20'. A second group of wafers change from a horizontal state to a vertical state to be processed in a second process chamber 140. The wafers processed in the second process chamber 140 changes from a horizontal state to a vertical state in the second aligning part 20'. The first group of the wafers and the second group of the wafers may be processed with the same recipe or different recipes.

INDUSTRIAL APPLICABILITY

As explained so far, a cleaning part of a cleaning facility according to the present invention has a plurality of multi-storied process chambers. Therefore, it is possible to reduce an install area of the cleaning facility. Since wafers are processed while being transferred along a loop shape, a loading/ unloading part and an aligning part are provided to only one side of the cleaning part. Therefore, an install area of the cleaning facility is smaller than conventional cleaning facility. When wafer are transferred between process chambers in the cleaning part, they are not exposed to the air. Therefore, it is possible to prevent formation of a native oxide layer on a wafer during a process.

The invention claimed is:

1. A substrate cleaning facility having a multi-storied structure, comprising:
a cleaning part including a plurality of process chambers having at least one process bath in which substrates are cleaned, the plurality of process chambers being stacked;
an interface part where substrates are transferred between the plurality of process chambers, the interface part includes:
a transfer bath containing one of the substrates to prevent exposure of the substrate to air, and
a transfer bath moving part for allowing the transfer bath to move up and down; and
a transfer robot,
wherein the transfer bath includes a nozzle configured to supply a cleaning solution thereinto,
the substrates are transferred between the plurality of process chambers while being submerged in the cleaning solution of the transfer bath,
the transfer bath further includes an exhaust valve configured to exhaust a cleaning solution,
the exhaust valve is made of an elastic member to continue to cut off its outlet when an external force is not applied,
the exhaust value includes:
a body;
a shield plate opposite to a bottom of the body in the body to open and close the outlet of the exhaust valve; and
a spring installed in the body to press the shield plate,
the interface part further includes a switch mounted on a bottom of the interface part for opening and closing the exhaust valve, and
the switch further includes a gas injection part for injecting a dry gas to the injection valve to dry the exhaust valve, wherein the switch includes:
a rod;
a body having a space into which at least a part of the rod is inserted and including first and second openings acting as a path through which a fluid flows in or out; and
a separation plate moved between formed positions of the first and second openings by the fluid flowing in through the first or second opening, wherein:
simultaneously to movement of the separation plate, the road pushes up the separation plate to open the exhaust valve, and
the gas injection part includes:
an injection line being a hole through which the separation plate and the rod to penetrate; and
an inflow port formed at the body to apply a dry gas to the injection line while the rod moves to close the exhaust valve.

2. The substrate cleaning facility of claim 1, wherein:
each of the process baths is configured for performing at least one selected from the group consisting of a chemical treating process, a rinsing process, and a drying process.

3. The substrate cleaning facility of claim 1, wherein:
each of the process chambers comprises:
a processing part where a plurality of processing baths are disposed; and
a transfer part where a transfer robot is installed to transfer the substrates between the process baths.

4. The substrate cleaning facility of claim 3, wherein:
the transfer robot of the process chamber having the processing bath in which a drying process is performed, comprises:
a first robot for transferring wet substrates; and
a second robot for transferring dry substrates.

5. The substrate cleaning facility of claim 2, wherein:
a buffer part where a cassette is temporarily disposed at the respective process chambers.

6. The substrate cleaning facility of claim 3, wherein:
each of the process chambers comprises:
a fan filter unit for sending a clean gas into the process chamber;
a first exhaust part configured for exhausting fumes around the processing bath; and
a second exhaust part configured for forcibly exhausting particles around the transfer part.

7. The substrate cleaning facility of claim 6, wherein:
the second exhaust part comprises:
an exhaust pipe connected to a bottom of the transfer part;
a damper for opening and closing a path of the exhaust pipe; and
an exhaust fan for regulating a displacement through the exhaust pipe.

8. The substrate cleaning facility of claim 1, wherein:
the transfer bath further comprises a cleaning solution supply pipe connected to a lateral face or a bottom of the transfer bath to supply a cleaning solution thereinto; and
the substrates are transferred between the process chambers while being submerged in the cleaning solution of the transfer bath.

9. The substrate cleaning facility of claim 1, wherein:
the cleaning solution is deionized (DI) water.

10. The substrate cleaning facility of claim 8, wherein:
when the substrates are contained in the transfer bath, a rinsing process is performed in the transfer bath.

11. The substrate cleaning facility of claim 1, wherein:
the transfer bath moving part comprises:
a frame extending to have a height from a lowest process chamber to a highest process chamber and having a guide rail;
a slider combined with the guide rail to move up and down therealong; and
a driving part for moving the slider,
wherein the transfer bath is mounted at the slider.

12. The substrate cleaning facility of claim 1, wherein the transfer bath comprises:
an inner bath in which the substrates are contained;
a cleaning solution supply part for supplying a cleaning solution into the inner bath; and
an outer bath, disposed to surround an outer sidewall of the inner bath, in which a cleaning solution overflowing from the inner bath is contained.

13. The substrate cleaning facility of claim 12, wherein:
when the substrates are contained in the transfer bath, a rinsing process is performed in the transfer bath.

14. The substrate cleaning facility of claim 12, wherein:
the cleaning solution supply part includes a cleaning solution supply pipe connected to a lateral face or a bottom of the inner bath.

15. The substrate cleaning facility of claim 12, wherein:
the cleaning solution supply part includes a nozzle configured for injecting a cleaning solution to an open top of the inner bath.

16. The substrate cleaning facility of claim 15, wherein:
a guide plate is installed at the interface part to guide a cleaning solution falling on an outer sidewall of the transfer bath to the inside of the transfer bath or the outside spaced apart from the outer sidewall of the transfer bath.

17. The substrate cleaning solution of claim 16 wherein:
one end of the guide plate extends inwardly toward an inner sidewall of the inner bath, and the other end thereof extends outwardly toward the outer sidewall of the outer bath.

18. The substrate cleaning solution of claim of claim 17, wherein:
the nozzle is fixedly installed at a determined position of the interface part; and
the guide plate is lower than the nozzle and is higher than the transfer bath.

19. The substrate cleaning facility of claim 16, wherein:
the interface part further comprises a guide plate moving part for moving the guide plate to be in a guide state where the flow of a cleaning solution is guided while the cleaning solution is supplied into the transfer bath and in a non-interference state where the movement of the transfer bath is not interfered.

20. The substrate cleaning facility of claim 1, further comprising:
a loading/unloading part in which a cassette is contained; and
an aligning part disposed between the loading/unloading part and the cleaning part to convert each substrate to a vertical state to a horizontal state or vice versa.

21. The substrate cleaning facility of claim 1, wherein the loading/unloading part includes:
an in/out port at which the cassette loaded/unloaded to/from the facility is placed; and
a stocker dished between the in/out port and the cleaning part to temporarily contain the cassettes,
wherein the stocker includes a rack on which the cassettes are placed, and a robot for transferring the cassette.

22. The substrate cleaning facility of claim 20, wherein:
the aligning part comprises at least one aligner for converting substrates to a vertical state from a horizontal state.

23. The substrate cleaning facility of claim 22, wherein:
the aligner comprises: at least one horizontal return robot for putting/drawing substrates in/out of a cassette; and
a rotatable repositioning device containing substrates returned by the horizontal return robot.

24. The substrate cleaning facility of claim 23, wherein:
the aligner further comprises a pusher for separating substrates from the repositioning device to transfer the substrates to the cleaning part.

25. The substrate cleaning facility of claim 20, wherein:
the substrates are cleaned while being transferred via the aligning part,
wherein a first process chamber is one of the process chambers, the interface part, a second process chamber being the other of the process chamber, and the aligning part.

26. The substrate cleaning facility of claim 25, wherein:
the cleaning baths are arranged in a row according to the order of processes performed in the firsts and second and process chambers.

* * * * *